(12) United States Patent
Rockway et al.

(10) Patent No.: US 10,141,648 B2
(45) Date of Patent: Nov. 27, 2018

(54) HIGH FREQUENCY SIMULTANEOUS METRICS ANTENNA (HF-SIMANT)

(71) Applicant: SPAWAR Systems Center Pacific, San Diego, CA (US)

(72) Inventors: John W. Rockway, San Diego, CA (US); John H. Meloling, San Diego, CA (US); Aldo Monges, San Diego, CA (US); Michael P. Daly, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/272,253

(22) Filed: Sep. 21, 2016

(65) Prior Publication Data

US 2018/0076523 A1 Mar. 15, 2018

Related U.S. Application Data

(63) Continuation-in-part of application No. 15/263,550, filed on Sep. 13, 2016.

(51) Int. Cl.
*H01Q 7/00* (2006.01)
*G01S 1/00* (2006.01)
(Continued)

(52) U.S. Cl.
CPC .............. *H01Q 7/00* (2013.01); *G01S 1/00* (2013.01); *H01Q 1/14* (2013.01); *H01Q 7/005* (2013.01);
(Continued)

(58) Field of Classification Search
CPC .......... H01Q 7/00; H01Q 1/288; H01Q 7/005; H03H 2/008
(Continued)

(56) References Cited

U.S. PATENT DOCUMENTS 3,534,372 A * 10/1970 Stark ................. H01Q 7/00
343/742
2011/0018774 A1 * 1/2011 Kikin ................ H01Q 1/2216
343/728

(Continued)

OTHER PUBLICATIONS

Huang et al; Balancing Magnetic and Electric responses of Vector—Sensing Antenna; Antennas and Propagation Society International Symposium, IEEE, 2001.
(Continued)

*Primary Examiner* — Dameon E Levi
*Assistant Examiner* — Ricardo Magallanes
(74) *Attorney, Agent, or Firm* — SPAWAR Systems Center Pacific; Kyle Eppele; Elliott Deaderick

(57) ABSTRACT

An antenna comprising: a loop made of conductive material; two baluns connected to, and intersecting, opposing sides of the loop, wherein each balun has an output; a 180° hybrid coupler having two input ports, a sum output port, and a delta output port, wherein the two input ports are connected to the outputs of the baluns; a first low noise amplifier (LNA) connected to the sum output port; a second LNA connected to the delta output port; first and second receivers connected to the first and second LNAs respectively; and wherein the antenna is electrically small and is designed to simultaneously receive wideband signals in real time from 3 to 30 MHz.

17 Claims, 16 Drawing Sheets

(51) Int. Cl.
    *H01Q 1/14*  (2006.01)
    *H01Q 21/24*  (2006.01)
    *H01B 1/18*  (2006.01)
    *H03H 2/00*  (2006.01)
    *H04B 1/18*  (2006.01)

(52) U.S. Cl.
    CPC ............ *H01Q 21/24* (2013.01); *H03H 2/008* (2013.01); *H04B 1/18* (2013.01)

(58) Field of Classification Search
    USPC ........................................ 343/741; 455/193.1
    See application file for complete search history.

(56) References Cited

U.S. PATENT DOCUMENTS

2014/0287704 A1* 9/2014 Dupuy ................ H04B 1/0475
                                                    455/114.2
2015/0372395 A1* 12/2015 Lavedas ................ H01Q 21/28
                                                    343/748
2017/0229787 A1* 8/2017 Fenn ...................... H01Q 25/04

OTHER PUBLICATIONS

King, "The Rectangular Loop Antenna as a Dipole," IRE Transactions on Antennas and Propagation, vol. AP-7, pp. 53-61, Jan. 1959.
Whiteside et al., "The Loop Antenna as a Probe," IEEE Transactions on Antennas and Propagation, vol. 12, pp. 291-297, May 1964.
S. Tofani, P. Ossola, G. D'Almore, L. Anglesio, M. Kanda, A. Novotny, "A Three-Loop Antenna System for Performing Near-Field Measurements of Electric and Magnetic Fields from Video Display Terminals", IEEE Transactions on Electromagnetic Compatibility, vol. 38, No. 3, Aug. 1996.
am-dx.com; Copper Tube Loop; available on the internet at http://www.am-dx.com/loopant.htm,Feb. 19, 2006.

* cited by examiner

Loop Mode

Dipole Mode

HIGH FREQUENCY SIMULTANEOUS METRICS ANTENNA (HF-SIMANT)

CROSS-REFERENCE TO RELATED APPLICATION

This application is a continuation-in-part of prior U.S. application Ser. No. 15/263,550, filed 13 Sep. 2016, titled "Six Degrees of Freedom Ground Exploiting Vector Sensor Antenna (6Ge Antenna)" (Navy Case #102566), which application is hereby incorporated by reference herein in its entirety for its teachings, and referred to hereafter as "the parent application."

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102502.

BACKGROUND OF THE INVENTION

The antenna disclosed herein relates to the field of High Frequency (HF) communications and direction-finding system applications. Previous systems for direction-finding and HF communications have attempted to meet the following requirements with varying degrees of success: simultaneous dipole and loop mode performance, low noise, electrically small and wideband operation from 3 to 30 MHz. Some prior art systems use many antenna structures operating in different modes, and in many implementations, covering different parts of the 3 to 30 MHz spectrum to meet these requirements. Problems encountered by prior art systems include, among other things, installation difficulty, balun design difficulty, and poor antenna performance.

SUMMARY

Described herein is an antenna comprising: a loop, two baluns, a 180° hybrid coupler, first and second low noise amplifiers (LNAs), an first and second receivers. The loop is made of conductive material. The two baluns are connected to, and intersect, opposing sides of the loop. Each balun has an output. The 180° hybrid coupler has two input ports, a sum output port, and a delta output port. The two input ports are connected to the outputs of the baluns. The first LNA is connected to the sum output port. The second LNA is connected to the delta output port. The first and second receivers are connected to the first and second LNAs respectively. The antenna described herein and claimed hereafter is electrically small and is designed to simultaneously receive wideband signals in real time from 3 to 30 MHz.

An embodiment of the antenna may be described as comprising first, second, and third loop antennas. In this embodiment of the antenna, each of the first, second, and third loop antennas is similar to the antenna described above. The loops of the first, second, and third loop antennas are disposed in mutually orthogonal planes and are positioned such that they do not touch each other. This embodiment of the antenna may function as a HF direction-finding antenna that is capable of simultaneously operating in dipole and loop mode and is capable of simultaneously receiving wideband signals in real time from 3 to 30 MHz.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed antenna below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other antenna or method related thereto described herein as will be understood by one of ordinary skill in the art unless otherwise stated specifically.

Figure 1:
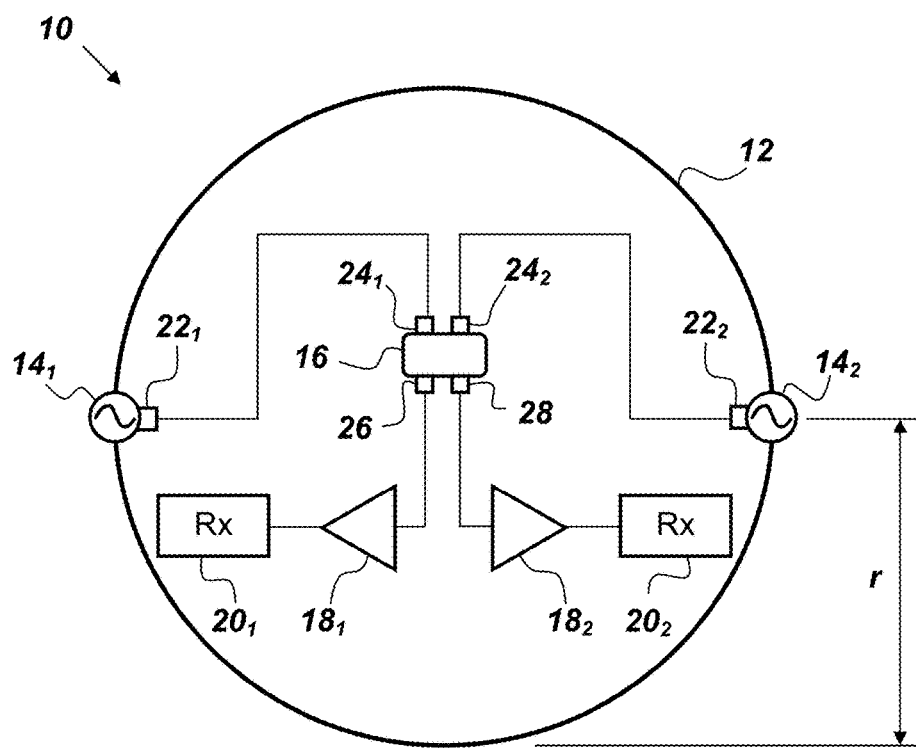
FIG. 1 is a perspective view of a general pictorial of a high frequency simultaneous metrics antenna.

FIG. 1 is a side view illustration of an embodiment of a High Frequency Simultaneous Metrics Antenna 10 (referred to hereafter as the HF-SIMANT 10). The HF-SIMANT 10 comprises, consists of, or consists essentially of a conductive loop 12, two baluns $14_1$ and $14_2$, a 180° hybrid coupler 16, first and second low noise amplifiers (LNAs) $18_1$ and $18_2$, an first and second receivers $20_1$ and $20_2$. The two baluns $14_1$ and $14_2$ are connected to, and intersect, opposing sides of the loop 12. Each balun 14 has an output 22. The 180° hybrid coupler has two input ports $24_1$ and $24_2$, a sum output port 26, and a delta output port 28. The two input ports $24_1$ and $24_2$ are connected to the outputs of the baluns $22_1$ and $22_2$. The first LNA $18_1$ is connected to the sum output port 26. The second LNA $18_2$ is connected to the delta output port 28. The first and second receivers $20_1$ and $20_2$ are connected to the first and second LNAs $18_1$ and $18_2$, respectively. The HF-SIMANT 10 is electrically small and is designed to simultaneously receive wideband signals in real time from 3 to 30 MHz.

The radius r of the loop 12 is a design variable that may be adjusted depending on the desired performance range. For example, the radius r of the loop 12 may be 0.5 meters for suitable wideband (i.e., 3 to 30 MHz) performance. The shape of the loop 12 is also a design variable. The loop 12 may be circular, octagonal, rectangular, etc. The loop 12 may be made of any conductive material and may be solid or hollow. For example, in one embodiment, the loop 12 may be fabricated as an octagon using copper tubing having a diameter of approximately 1.5 cm (0.6 inches).

Figure 2:
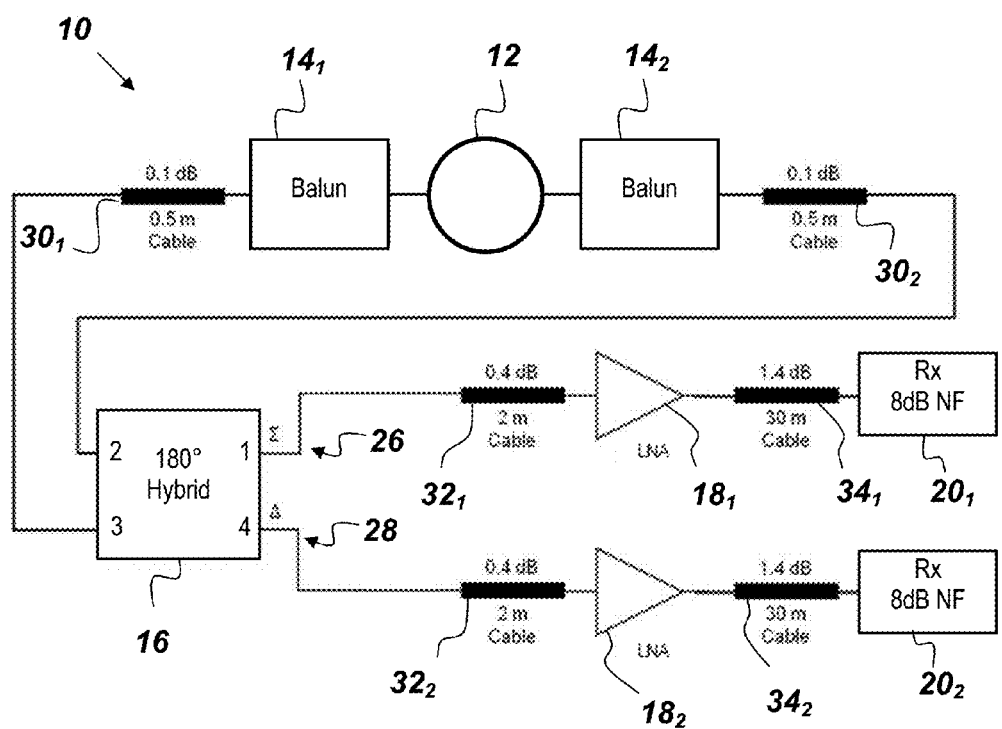
FIG. 2 is a block diagram of an embodiment of a high frequency simultaneous metrics antenna.

FIG. 2 is a detailed block diagram of an example embodiment of the HF-SIMANT 10. In this embodiment shown in the block diagram, each balun 14 is connected to a transmission line 30 of approximately 0.5 meters length. The transmission loss for the transmission line may be expected to be approximately 0.1 dB. Both transmission lines $30_1$ and $30_2$ are connected into the 180-degree hybrid coupler 16. The output of the SUM ($S_E$) port 26 is the sum of the two input signals. The output of the DELTA ($I_N$) port 28 is the difference of the two input signals. In this embodiment of the HF-SIMANT 10, both the SUM and DELTA outputs are followed by coaxial cables $32_1$ and $32_2$, both of which measure 2 meters in length, and are followed by the low noise LNAs $18_1$ and $18_2$. Suitable examples of the LNAs $18_1$ and $18_2$ include, but are not limited to, the Shireen LNA-643 with a Noise Figure of 2.5 dB, and an IP3 of 35 dBm and a gain of 41 dB. Then, in this embodiment, both LNAs $18_1$ and $18_2$ are then followed by 30 meter cables $34_1$ and $34_2$ with approximately 1.4 dB of loss. The SUM signal and the DELTA signal are then inputs to receivers $20_1$ and $20_2$ where 8 dB NF may be assumed. Each of the receivers $20_1$ and $20_2$ may be any radio receiver that operates at HF. A suitable, non-limiting, example of the receiver 20 is a RFSPACE SDR-IP software-defined radio. At a bare minimum, each of the receivers $20_1$ and $20_2$ would need to have a mixer, a low pass filter to down-convert a signal to baseband, and an analog to digital converter. The specific values described above and shown in FIG. 2 were selected to meet several performance metrics of an HF receive antenna. These performance metrics include dual-mode (i.e., both dipole and loop), wideband (i.e., 3 to 30 MHz), low noise, and electrically small (i.e., electrically smaller than the highest operating frequency of 30 MHz). Other specific values may be used for other desired performance and/or antenna size. The baluns 14 may be any desired size and have any desired value depending on the desired performance. For example, in the embodiment of the HF-SIMANT 10 shown in FIG. 1, the baluns are 1:1 Transmission Line Transformers (TLTs) that use 50Ω twisted-pair transmission lines. Still referring to the same embodiment, each balun will add phase delay associated with the electrical length of the twisted-pair transmission line; the phase delay through the balun 14 was measured and fit to a straight line ($\phi_{Balun}=-0.55\, f_{MHz}$). Another suitable embodiment of the balun 14 includes, but is not limited to, a 9:1 balun.

Figure 3:
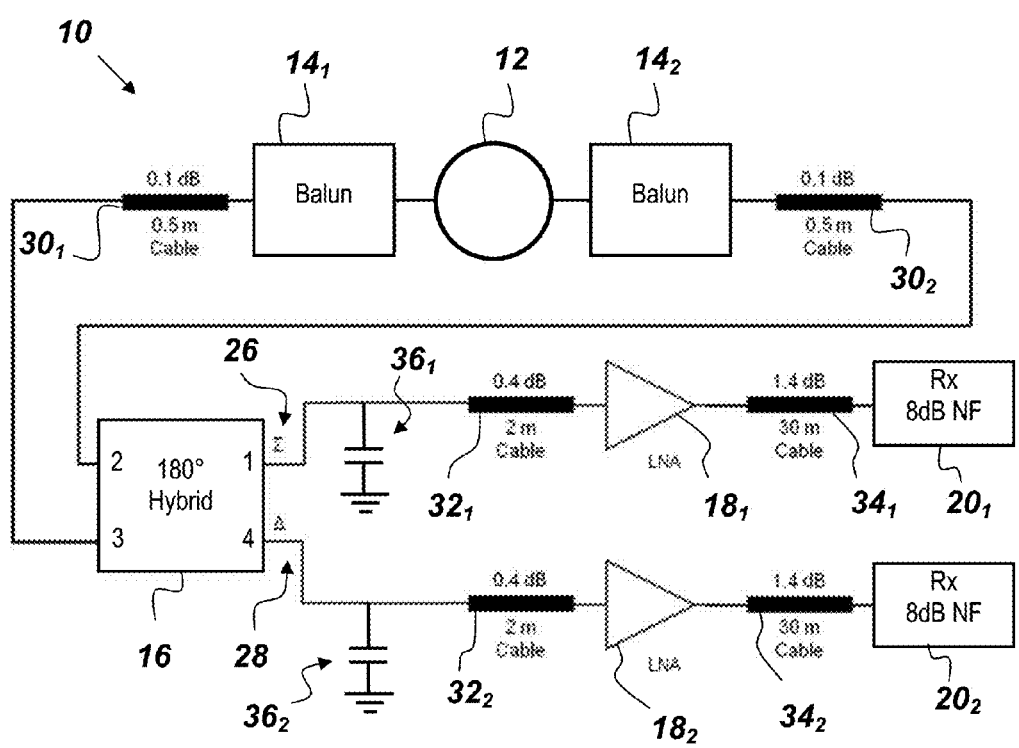
FIG. 3 is a block diagram of an embodiment of a high frequency simultaneous metrics antenna.

FIG. 3 is a detailed block diagram of another example embodiment of the HF-SIMANT 10. This embodiment of the HF-SIMANT 10 further comprises first and second matching networks $36_1$ and $36_2$, which are respectively connected in parallel to the sum output port 26 and the delta output port 28. The matching networks $36_1$ and $36_2$ may be any broadband matching network capable of balancing source and load impedances. In the embodiment of the HF-SIMANT 10 shown in FIG. 3, the matching networks $36_1$ and $36_2$ are capacitors, each capacitor having two terminals, one of which is grounded and the other is connected to its respective output port of the 180° hybrid coupler 16.

Figure 4A:
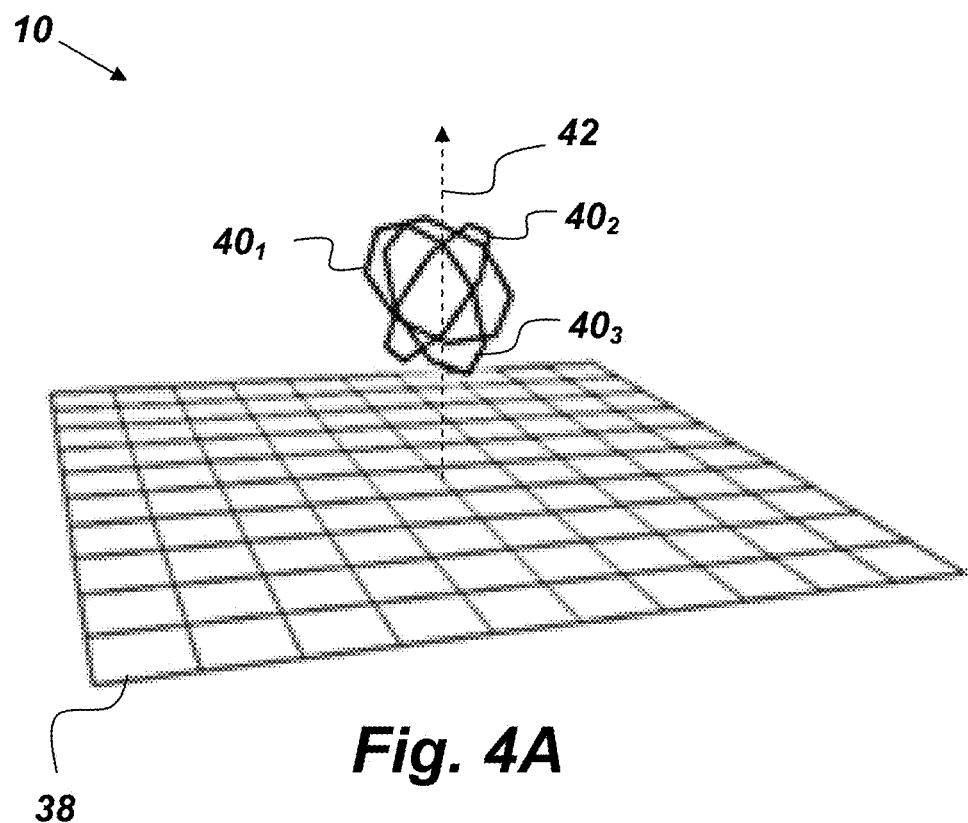
FIG. 4A is a perspective view of an embodiment of a high frequency simultaneous metrics antenna.
Figure 4B:
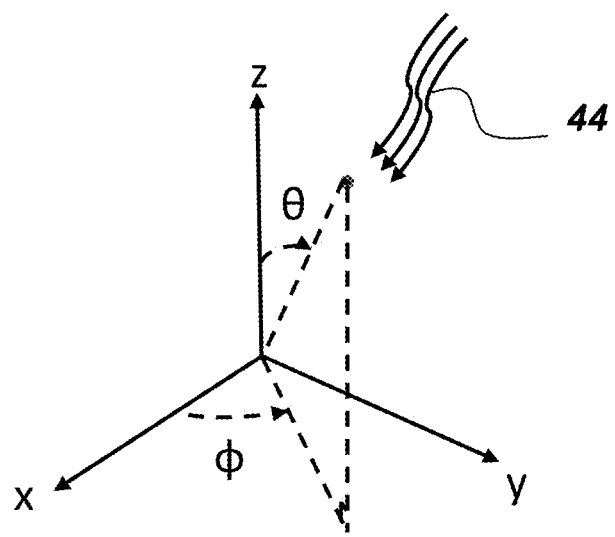
FIG. 4B is an illustration of a coordinate plane.

FIG. 4A is a perspective illustration of a vector sensing embodiment of the HF-SIMANT 10 comprising first, second, and third loop antennas $40_1$, $40_2$, and $40_3$ that are orthogonal to each other and are disposed above a ground plane 38. In this embodiment, each of the first, second, and third loop antennas $40_1$, $40_2$, and $40_3$ is similar to the embodiment of the HF-SIMANT 10 shown in FIG. 1. The loops of the first, second, and third loop antennas $40_1$, $40_2$, and $40_3$ are disposed in mutually orthogonal planes and are positioned such that they do not touch each other. This embodiment of the HF-SIMANT 10 may function as a HF direction-finding antenna that is capable of simultaneously operating in dipole and loop mode and is capable of simultaneously receiving wideband signals in real time from 3 to 30 MHz. The three loop antennas $40_1$, $40_2$, and $40_3$ are evenly spaced in azimuth around a vertical axis 42 and provide excellent dual-mode (i.e., dipole and loop) performance. FIG. 4B shows a received signal 44 and a three-dimensional coordinate plane. The angle phi $\Phi$ is shown in FIG. 4B.

Figure 5A:
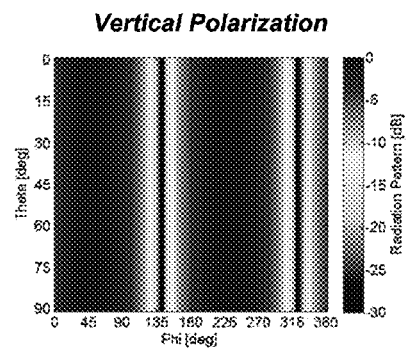
FIGS. 5A-5B are plots of polarization responses of a high frequency simultaneous metrics antenna in loop mode.
Figure 5B:
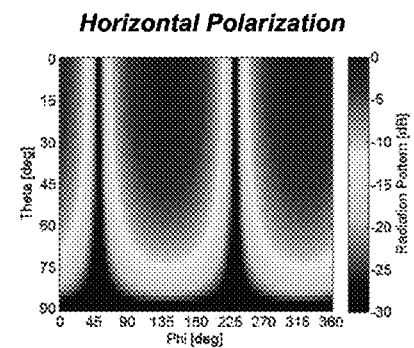
Figure 5C:
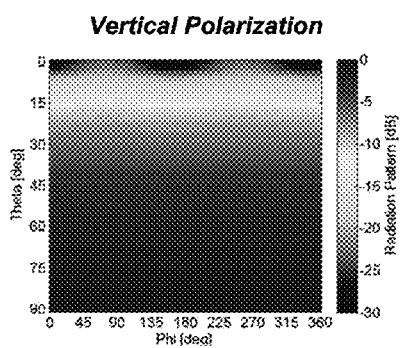
FIGS. 5C-5D are plots of polarization responses of a high frequency simultaneous metrics antenna in dipole mode.
Figure 5D:
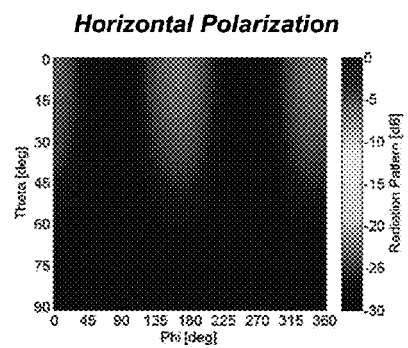

FIGS. 5A-5D are plots of polarization responses of the vector sensing embodiment of the HF-SIMANT 10 shown in FIG. 4A in loop mode at 3 MHz. FIG. 5A is a plot of the vertical polarization response and FIG. 5B is a plot of the horizontal polarization response of the aforementioned embodiment. FIGS. 5C-5D are plots of polarization responses of the vector-sensing embodiment of the HF-SIMANT 10 shown in FIG. 4A in dipole mode at 3 MHz. FIG. 5C is a plot of the vertical polarization response and FIG. 5D is a plot of the horizontal polarization response of the aforementioned embodiment. Theta $\theta$ is the zenith angle of the receive signal 40. Phi $\Phi$ is the azimuthal angle measured from the x-axis of the receive signal 44. The radiation pattern in FIGS. 5A-5B is the receive directivity of the vector sensing embodiment of the HF-SIMANT 10 shown in FIG. 4A in loop mode. The radiation pattern in FIGS. 5C-5D is the receive directivity of the vector sensing embodiment of the HF-SIMANT 10 shown in FIG. 4A in dipole mode. The receive frequency in FIGS. 5A-5D was 3 MHz. The HF-SIMANT 10 is capable of simultaneously supporting the reception of both the dipole and loop modes.

The HF-SIMANT 10 may be designed to keep its system noise below that of external high frequency (HF) noise. Because the HF-SIMANT 10 is primarily designed to receive signals it can tolerate inefficient, mismatched antennas if the internal system noise is much lower than external environmental noise, because the small antenna will reject the desired signal and in-band external noise equally. Sources of HF external noise are galactic noise, atmospheric noise, and man-made noise. Galactic noise from space is usually much lower power than atmospheric noise, which is primarily from lightning strikes. Major sources of man-made noise are engines and power distribution equipment, and noise power varies by location. The International Telecommunication Union categorizes locations by their expected noise level into Quiet Rural, Rural, Urban, and Industrial. The embodiment of the HF-SIMANT 10 shown in FIG. 4A is designed to have a system noise level less than the expected noise level of a Quiet Rural environment, over the HF band. The antenna has a system noise figure that is less than quiet rural noise levels set by the International Radio Consultative Committee (CCIR).

Figure 6:
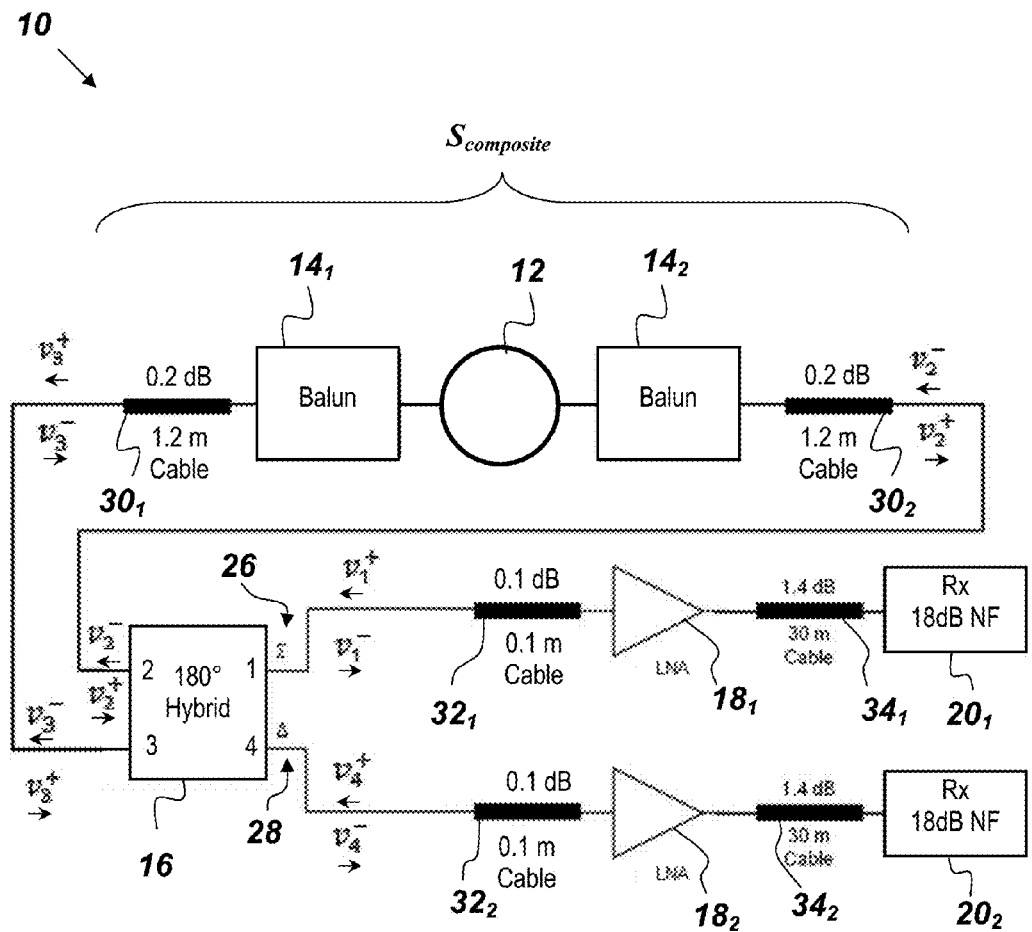
FIG. 6 is a block diagram of an embodiment of a high frequency simultaneous metrics antenna.

The system noise level may be computed assuming a somewhat simplified radio frequency (RF) receive chain such as represented by the block diagram shown in FIG. 6. The computation neglects bias tees and transient protection devices because these components should not introduce significant loss or mismatch at HF and thus contribute little to the system noise level. The components that will set the system noise level are the loops 12, the baluns 14, the hybrid coupler 16, the LNAs 18, the receivers 20, and the cables 30, 32, and 34. The noise figure NF is given by:

$$NF_i = 10\log_{10}\left(1 + \frac{T_i}{T_0}\right) dB \quad (1)$$

where i=Σ or Δ corresponding to the noise figure of the dipole or loop mode, respectively. The mismatch factor through the 180° hybrid coupler 16 is different for the dipole and loop modes, as will be shown next, so the system noise figure is slightly different. $T_0$ is the standard noise temperature, 290° K. The system noise temperature, $T_i$, is given by $$T_i = T_0\left(\frac{1-\eta_r}{\eta_r} + \frac{1-G_{cable1}}{\eta_r \tau_{feedpoint} G_{cable1}} + \right.$$
$$\frac{1-G_{hybrid}}{\eta_r \tau_{feedpoint} G_{cable1} G_{hybrid}} + \frac{1-G_{cable2}}{\eta_r \tau_{feedpoint} G_{cable1} G_{hybrid} \tau_i G_{cable2}} +$$
$$\frac{f_{LNA}-1}{\eta_r \tau_{feedpoint} G_{cable1} G_{hybrid} \tau_i G_{cable2}} +$$
$$\frac{1-G_{cable3}}{\eta_r \tau_{feedpoint} G_{cable1} G_{hybrid} \tau_i G_{cable2} G_{LNA} G_{cable3}} +$$
$$\left.\frac{f_{RX}-1}{\eta_r \tau_{feedpoint} G_{cable1} G_{hybrid} \tau_i G_{cable2} G_{LNA} G_{cable3}}\right) \quad (2)$$

where the following variables are defined going from the conductive loop 12 to the receiver 20:

$\eta_r$ is the antenna radiation efficiency;

$\tau_{feedpoint}$ is the mismatch loss after the baluns 14;

$G_{cable1}$ is the gain (less than unity) of the cable connecting the balun 14 to the 180° hybrid coupler 16;

$G_{hybrid}$ is the gain (less than unity) through the 180° hybrid coupler 16;

$\tau_i$ is the hybrid port i mismatch loss;

$G_{cable2}$ is the gain (less than unity) of the cable connecting the 180° hybrid coupler 16 to the LNA 18;

$f_{LNA}$ is the noise factor of the LNA 18;

$G_{LNA}$ is the gain of the LNA 18;

$G_{cable3}$ is gain of the cable connecting the LNA 18 to the receiver 20; and $F_{RX}$ is the noise factor of the receiver 20.

The antenna radiation efficiency may be supplied by computer simulations, and the mismatch may be from the measured S-parameters. An example of a suitable program for providing computer simulations is MININEC Pro Antenna Analysis Software. The attenuation from cables 30, 32, and 34, the gain of the LNA 18, and the noise factor of the LNA 18 and receiver 20 can be obtained from manufacturer specifications. The incoming voltage waves ($v^+$) into the 180° hybrid coupler 16 and outgoing voltage waves ($v^-$) are related to the S-parameters by:

$$\begin{bmatrix} v_1^- \\ v_2^- \\ v_3^- \\ v_4^- \end{bmatrix} = S_{hybrid} \begin{bmatrix} v_1^+ \\ v_2^+ \\ v_3^+ \\ v_4^+ \end{bmatrix} \quad (3)$$

The 180° hybrid coupler 16 may be assumed to be ideal since at HF its loss is negligible. The S-parameters of the 180° hybrid coupler 16 are given by:

$$S_{hybrid} = \frac{-j}{\sqrt{2}} \begin{bmatrix} 0 & 1 & 1 & 0 \\ 1 & 0 & 0 & -1 \\ 1 & 0 & 0 & 1 \\ 0 & -1 & 1 & 0 \end{bmatrix} \quad (4)$$

Equation 4 may be used to determine the hybrid coupler sum and difference ports mismatch losses in the following manner. Let the S-parameter matrix $S_{composite}$ consist of the two-port loop antenna shown in FIG. 6 including everything from a conductive loop 12 up to the two coaxial cables 30 that connect to the 180° hybrid coupler 16. The same voltage waves defined for the 180° hybrid coupler 16 in equation 3 are now related to this $S_{composite}$ two-port by:

$$\begin{bmatrix} v_2^+ \\ v_3^+ \end{bmatrix} = S_{composite} \begin{bmatrix} v_2^- \\ v_3^- \end{bmatrix} = \begin{bmatrix} s_{11} & s_{12} \\ s_{21} & s_{22} \end{bmatrix}\begin{bmatrix} v_2^- \\ v_3^- \end{bmatrix} \quad (5)$$

The reflection coefficients looking into the sum and difference ports (26 and 28 respectively) of the 180° hybrid coupler 16 are given by the following two equations:

$$\Gamma_{in,\Sigma} = \frac{v_1^-}{v_1^+}\bigg|_{v_4^+=0} \quad (6)$$

$$\Gamma_{in,\Delta} = \frac{v_4^-}{v_4^+}\bigg|_{v_1^+=0} \quad (7)$$

These may be written in terms of the S-parameters of the composite two-port connected to the 180° hybrid coupler 16:

$$\Gamma_{in,\Sigma} = -\frac{1}{2}(s_{11} + s_{12} + s_{21} + s_{22}) \quad (8)$$

$$\Gamma_{in,\Delta} = \frac{1}{2}(-s_{11} + s_{12} + s_{21} - s_{22}) \quad (9)$$

The mismatch factors at the sum and difference ports (22 and 24 respectively) of the 180° hybrid coupler 16 may be computed by:

$$\tau_\Sigma = 1 - |\Gamma_{in,\Sigma}|^2 \quad (10)$$

$$\tau_\Delta = 1 - |\Gamma_{in,\Delta}|^2 \quad (11)$$

All of these inputs may be used to calculate the system noise temperature in Equation 2 which may be used in Equation 1 to calculate the system noise figure.

Figure 7A:
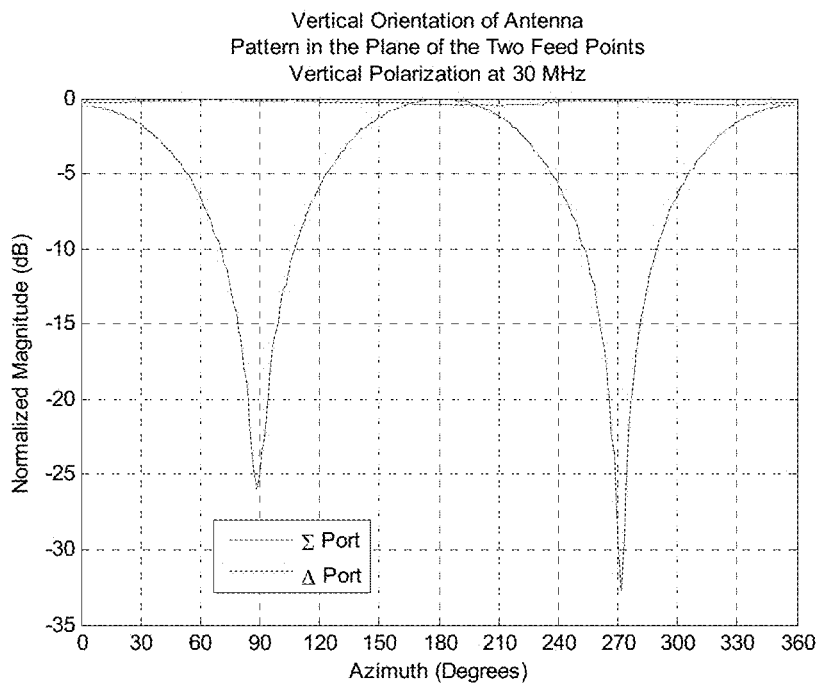
FIGS. 7A-7B are plots of antenna patterns of a high frequency simultaneous metrics antenna in loop mode.
Figure 7B:
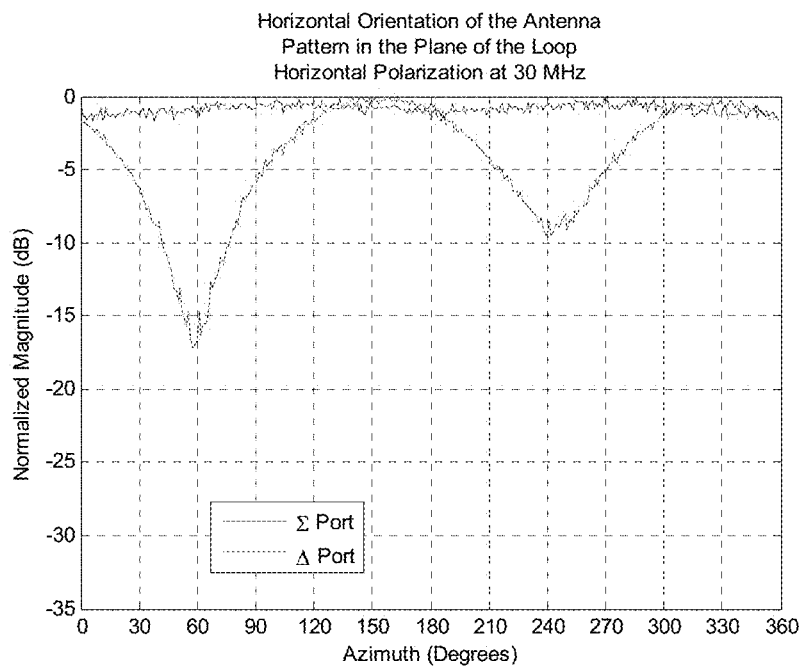

FIGS. 7A and 7B are plots showing the measured antenna pattern for an octagonal embodiment of the HF-SIMANT 10 having a circumference of approximately 3.4 meters. This embodiment of the HF-SIMANT 10 is a small antenna, because the circumference is 0.34 wavelengths at the highest operating frequency of 30 MHz. The pattern shown in FIG. 7A. is for a vertical orientation of the antenna, with the pattern in the plane of the two feed points (baluns), and vertical polarization at 30 MHz. In FIG. 7A, the upper trace corresponds to the delta port and the lower trace corresponds to the sum port. The pattern in FIG. 7B is for a horizontal orientation of the antenna, with the pattern in the plane of the loop 12, and horizontal polarization at 30 MHz. In FIG. 7B, the upper trace corresponds to the sum port and the lower trace corresponds to the delta port.

FIG. 7A shows the classic antenna pattern for a small loop antenna. FIG. 7B shows the classic antenna pattern for a small dipole antenna. HF-SIMANT 10 is a small antenna at 30 MHz. Therefore, as the frequency is decreased to 3 MHz, the antenna pattern structure will be maintained. The directivity of the antenna pattern does not change with frequency. The measurements also confirm that both a dipole and loop mode are available using an appropriate two-port feed system such as is shown by the baluns 14 in FIGS. 1-3. The dipole and loop modes are maintained from 3 to 30 MHz.

Figure 8:
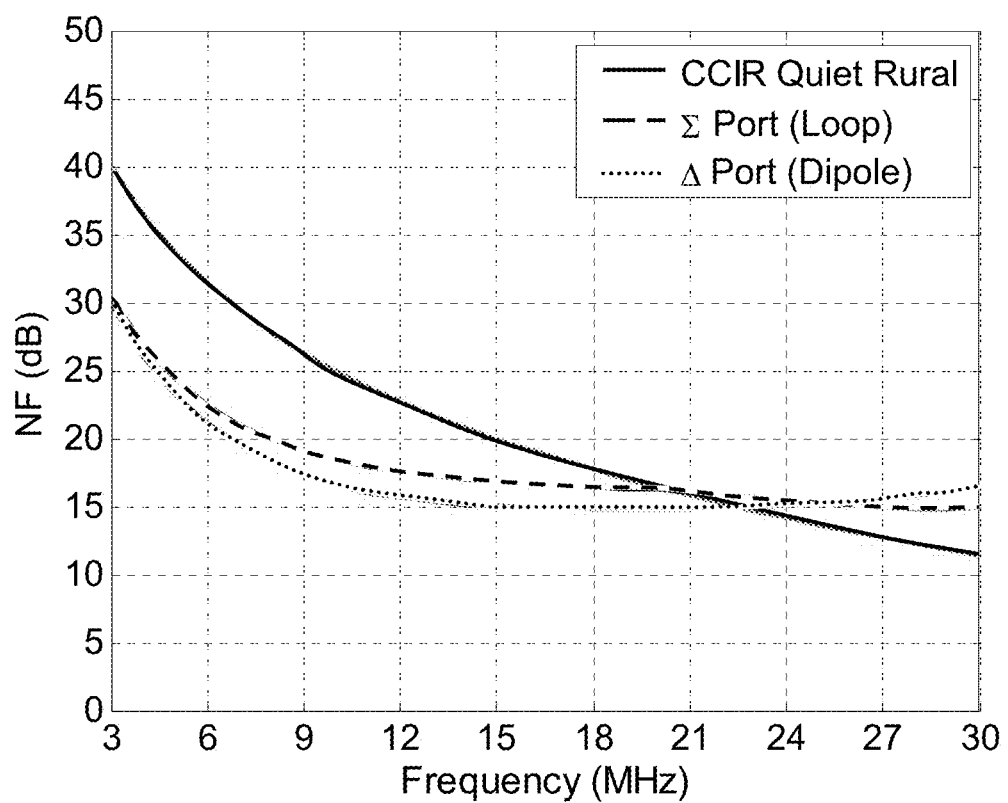
FIG. 8 is a plot of calculated system noise figures.

FIG. 8 is a plot of calculated system noise figures of sum (dipole mode) and difference (loop mode) of the octagonal embodiment of the HF-SIMANT 10 having a circumference of approximately 3.4 meters compared to the Quiet Rural HF noise model. Well-designed HF receive systems are external noise limited. In other words, the Noise Figure is maintained below the Noise Figure for a given noise environment. As shown by FIG. 8, this embodiment of the HF-SIMANT 10, in both the dipole and loop mode, has a Noise Figure below the quiet rural Noise Figure (below 20 MHz) and only slightly above that for frequencies higher than 20 MHz. The graph in FIG. 8 shows that the expected noise in a Quiet Rural environment is higher than the system noise figure for both the loop and dipole synthesized antenna patterns.

Figure 9:
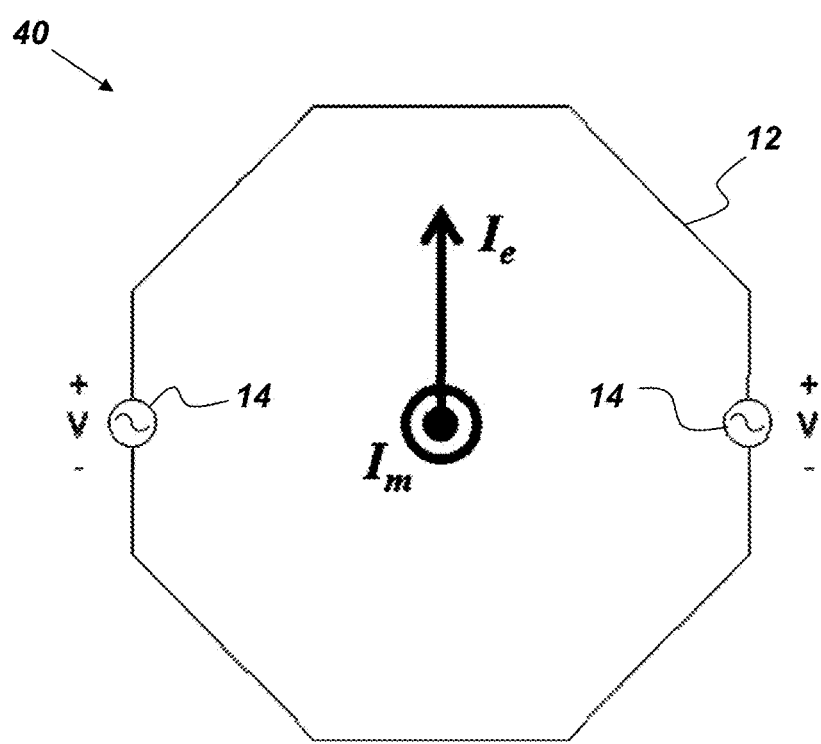
FIG. 9 is a perspective view of a general pictorial of an octagonal high frequency simultaneous metrics antenna.

FIG. 9 is a general pictorial of an embodiment of the loop antenna 40. The loop antenna 40 with its two ports (baluns 14) has some interesting and unique properties. As discussed above, since the two ports are diametrically opposed, the loop can be made to operate in two modes. The difference of the two port voltages results in constant current flow around the loop 12. This generates a magnetic dipole moment ($I_m$) orthogonal to the plane of the loop. Similarly, the sum of the two port voltages results in current flow in opposite directions around the loop. In this case, the currents cancel each other at the top and bottom of the loop generating an electric dipole moment ($I_e$) in the plane of the loop and orthogonal to the two ports. The adding and subtracting of these port voltages for each loop antenna is effectively accomplished using the 180° hybrid coupler 16. Placing three of these loops orthogonal to each other results in three orthogonal electric dipole moments and three orthogonal magnetic dipole moments. The same matching may be used for the loop and dipole modes. Note that in the HF-SIMANT 10 there are no long dipoles protruding through the loops.

Figure 10A:
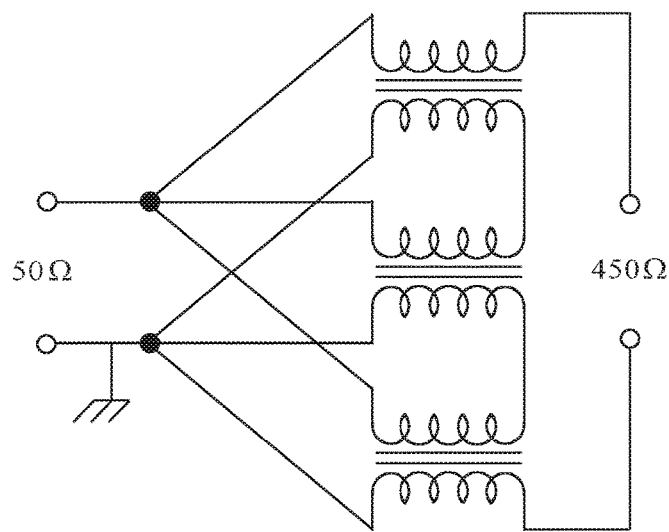
FIG. 10A is a circuit diagram.
Figure 10B:
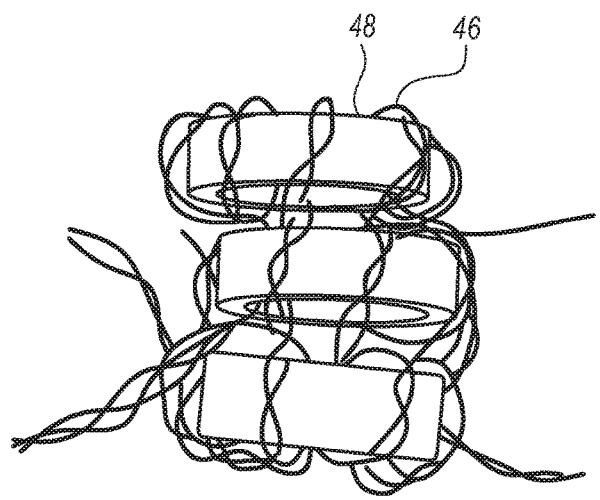
FIG. 10B is a photo of an example balun.

FIG. 10A is a circuit model of a 9:1 embodiment of the balun 14, an example of which is shown in FIG. 10B. In this embodiment, the balun 14 consists of three twisted-pair transmission lines 46 wrapped on three ferrite toroids 48 with the leads connected as shown in FIG. 10A. This embodiment of the balun 14 is intended to be used with a loop 12 made of copper tubing, but it is to be understood that this is only offered as an example embodiment and that the HF-SIMANT is not limited to the embodiment of the balun 14 described hereafter. The toroid diameter may be selected so the balun 14 may fit inside the loop 12 (e.g., when the loop 12 is made of tubing). The balun 14 may be attached to the end of a feed coax line 50 (shown in FIG. 11) and may be potted with epoxy to prevent stress on either the coax or the balanced twin-leads. This also serves to seal the balun from moisture.

Figure 11:
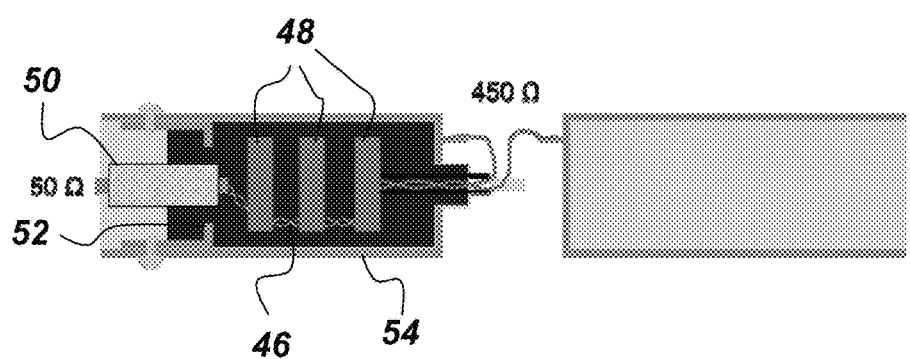
FIG. 11 is a cross-sectional, side-view of an example balun.

FIG. 11 is an internal side-view of an embodiment of the balun 14. In this embodiment, a metal collar 52 may be included and potted so the assembly can be secured to the tubing. This prevents the balun assembly from moving out of position. Third, a high-temperature sleeve 54 may be used to cover the outside of the coax and may be potted with the metal collar 52 of the balun assembly. A suitable material for the sleeve 54 is Ultra Temp 391TM-2-5 by Cotronics Corporation, which material is woven from continuous filament Alumina ceramic fibers that can withstand continuous temperatures of 2600° F. The sleeve 54 may be included so that some of the copper tubing could be soldered with the coax in place without causing damage to the coaxial cable.

Figure 12:
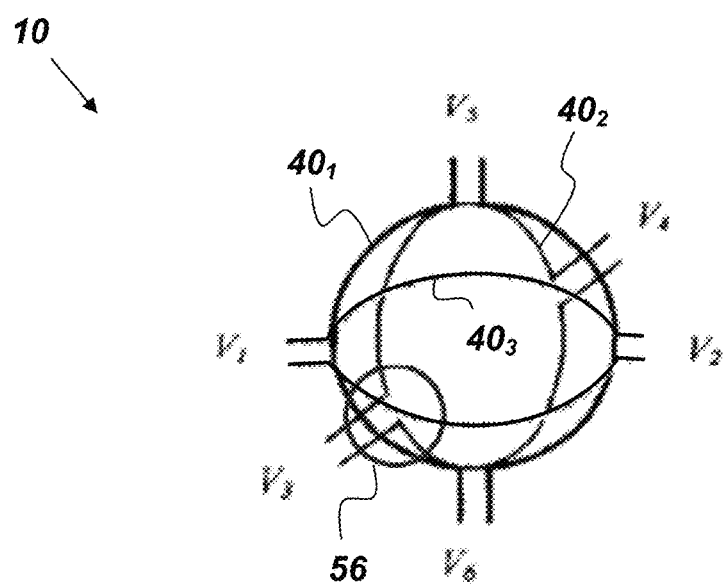
FIG. 12 is a perspective view of a general pictorial of a vector-sensing, three-orthogonal-loop, high frequency simultaneous metrics antenna.

FIG. 12 is an illustration of an embodiment of the HF-SIMANT 10. Note in this embodiment, the feed crossover sections, one of which is indicated by circle 56. It is seen in FIG. 12 that one of the other loop antennas 40 crosses at each one of the feed points. Therefore, it is desirable to design this cross-over section so that the conducting section of the other loop antenna 40 does not negatively impact the performance of the feed point. The conducting part of this design may be a wide copper strap soldered to a gap in the tubing. This provides a good ground connection to the conductive loop section and provides room for the feed point connection. The strap may be kept wide to minimize the inductance of the connection.

Figure 13:
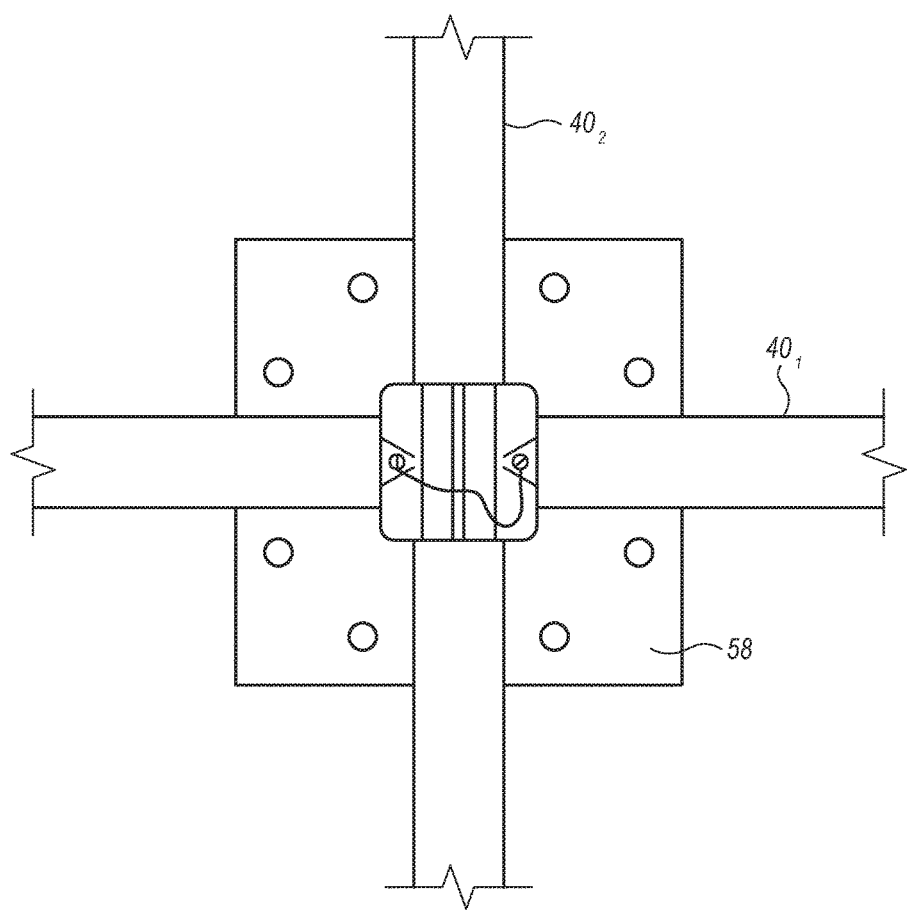
FIG. 13 is a photo of an antenna loop cross-over section.

FIG. 13 shows a photo of an inside view of the above-discussed cross-over design. The cross-over section may be fastened together with two insulating blocks 58, one of which is shown in FIG. 13. A suitable material for the insulating blocks 58 is Delrin, which is what is depicted in FIG. 13. The insulating blocks 58 are used to support the copper tubing of the two crossing loop antennas 40 and may be sealed together with any desired fastener or adhesive, such as gasket sealer.

Figure 14:
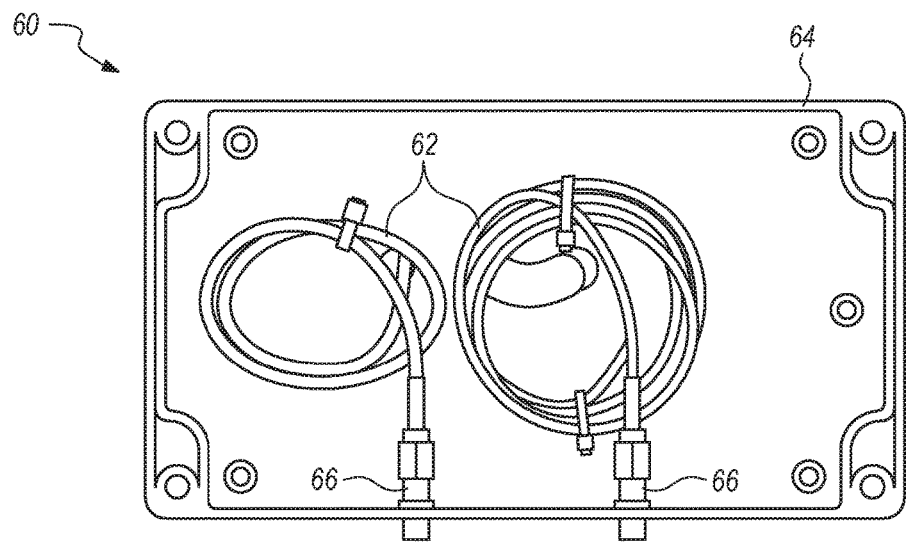
FIG. 14 is a photo of an example coaxial interface.

FIG. 14 is a photo of an optional coaxial cable interface 60. The HF-SIMANT 10 may include a separate coaxial cable interface. A separate coaxial interface is desirable since the baluns and cables within each loop antenna 40 are difficult to replace. For example, with respect to the three-orthogonal-copper-octagonal-loop embodiment of the HF-SIMANT 10 discussed above, the copper tubing would have to be soldered after the baluns 14 are installed. Therefore, if a cable is damaged, much of the antenna would need to be taken apart to repair the damage. To prevent this, the feed point cables 62 for each loop may be terminated in a plastic box 64 and attached to bulkhead connectors 66.

Figure 15:
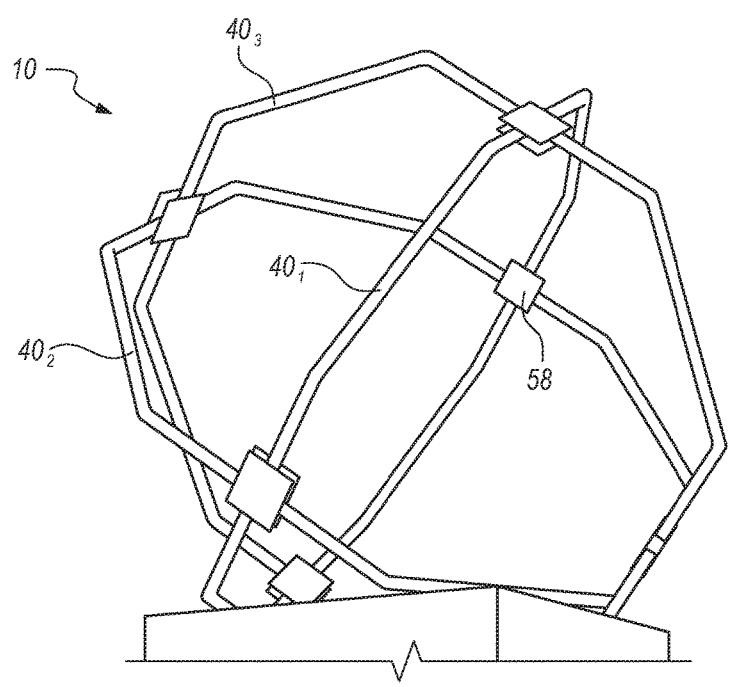
FIG. 15 is a photo of a vector-sensing prototype of a high frequency simultaneous metrics antenna.

FIG. 15 is a photo of a prototype three-orthogonal-copper-octagonal-loop embodiment of the HF-SIMANT 10 similar to that described above. As much of the tubing and elbows were soldered together as possible. This helped to keep each loop as close to octagonal and flat as possible. The antenna was assembled in sections using the feed point connections to keep the loops flat and orthogonal. Finally, baluns were installed and the remaining tubing soldered. The coax cables ran on the inside of the copper tubing and exited through copper T-sections soldered into the bottom of each loop. This prototype of the HF-SIMANT 10 was mounted to a non-conductive PVC plate (not visible in FIG. 15) such that the T-sections were mounted through the PVC plate. These holes were then sealed and the loops were attached to the PVC plate using insulating brackets (also not visible in FIG. 15), which in this embodiment were also made of Delrin.

The coaxial cable interfaces 60, one for each loop antenna 40, were mounted to the underside of the PVC plate.

Figure 16:
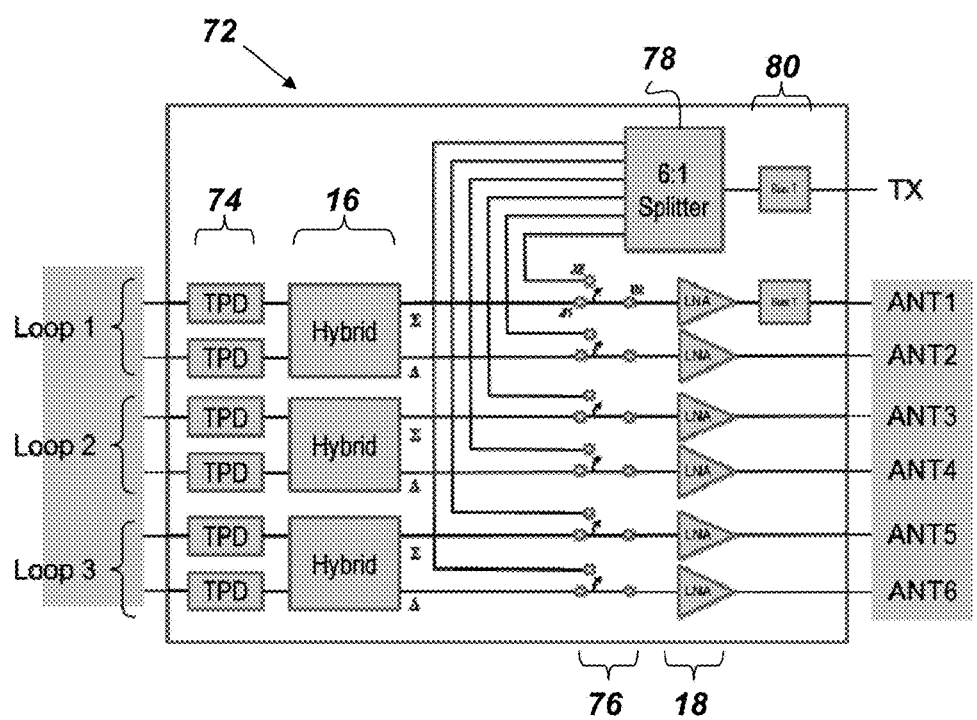
FIG. 16 is a circuit diagram.

The RF components of the HF-SIMANT 10, such as the 180° hybrid couplers 16 and the LNAs 18 may be part of an RF unit 72. FIG. 16 is a block diagram of an example embodiment of the RF unit 72 that, in addition to the hybrids and the LNAs of the basic system block diagram, this unit includes transient protection devices (TPDs) 74, coaxial switches 76 and a 6:1 power splitter 78 for calibration, and bias-T networks 80 to provide power to the LNAs 18 and coaxial switches 76. In a prototype embodiment of the RF unit 72 the following parts were used: TPDs from Fischer Custom Communications (FCC-550-5-SMA), hybrids from Universal Microwave Components Corporation (HC-W200-MS), coaxial switches from Mini-Circuits (MSP2TA-18-12+), power splitter from Mini-Circuits (ZFSC-6-1-S(+)), and LNAs from Shireen (LNA-643). One pair of bias-Ts is used to power the six LNAs. This required the bias-T network to provide 0.81 amps at 12 volts. Another pair of bias-Ts is used to power the coaxial switches. This required the bias-T network to provide up to 2.6 amps at 12 volts. A common 3 amp bias-T network was designed. To provide this function, a 3 amp HF bias-T network design was identified. This design was modeled using LTspice and it was determined that the rise time of the step response needed to be slowed to prevent damage to the LNAs. This was accomplished by including an RC network on each of the DC ports.

From the above description of the HF-SIMANT 10, it is manifest that various techniques may be used for implementing the concepts of the antenna without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the HF-SIMANT 10 is not limited to the particular embodiments described herein, but is capable of many embodiments without departing from the scope of the claims.

We claim:

1. An antenna comprising:
   a loop made of conductive material;
   two baluns connected to, and intersecting, opposing sides of the loop, wherein each balun has an output;
   a 180° hybrid coupler having two input ports, a sum output port, and a delta output port, wherein the two input ports are connected to the outputs of the baluns;
   a first low noise amplifier (LNA) connected to the sum output port;
   a second LNA connected to the delta output port;
   first and second matching networks respectively connected in parallel to the sum output port and the delta output port, wherein the first and second matching networks are capacitors, each capacitor having two terminals, one of which is grounded and the other is connected to its respective output port of the 180° hybrid coupler; and
   first and second receivers connected to the first and second LNAs, respectively,
   wherein the antenna sets a system noise level below external high frequency noise by utilizing a computation for a system noise figure that ignores bias tees and transient protection devices.

2. The antenna of claim 1, wherein the first matching network has a value of 200 pF and the second matching network has a value of 150 pF.

3. The antenna of claim 2, wherein each of the balun outputs is connected to the 180° hybrid coupler via a respective 0.5 m cable, wherein the sum and delta output ports are respectively connected to the first and second LNA via first and second 2 m cables, and the first and second LNAs are respectively connected to the first and second receivers via first and second 30 m cables.

4. The antenna of claim 1, wherein the loop is octagonal wherein the baluns are centered on opposing sides of the octagon.

5. The antenna of claim 4, wherein the loop is made of copper tubing having a loop radius of no greater than 0.54 m and a tubing diameter of no greater than 1.52 cm (0.6 in).

6. The antenna of claim 5, wherein the system noise figure is less than quiet rural noise levels set by the International Radio Consultative Committee (CCIR).

7. The antenna of claim 1, further comprising second and third antennas each of which having the same components as the antenna of claim 1, wherein the three antennas are disposed in mutually orthogonal planes and are positioned such that they do not touch each other, such that the three antennas together form a vector-sensing, high frequency (HF) direction-finding antenna.

8. A high frequency (HF) direction-finding antenna comprising:
   first, second, and third loop antennas, each of which comprising:
   a loop of conductive material, wherein the loops of the first, second, and third loop antennas are disposed in mutually orthogonal planes and are positioned such that they do not touch each other;
   two baluns connected to, and intersecting, opposing sides of the loop, wherein each balun has an output;
   a 180° hybrid coupler having two input ports, a sum output port, and a delta output port, wherein the two input ports are connected to the outputs of the baluns;
   a first low noise amplifier (LNA) connected to the sum output port;
   a second LNA connected to the delta output port; and
   first and second receivers connected to the first and second LNAs, respectively,
   wherein the HF direction-finding antenna is capable of simultaneously operating in dipole and loop mode, and
   wherein the antenna sets a system noise level below external high frequency noise by utilizing a computation for a system noise figure that ignores bias tees and transient protection devices, wherein the computation for the system noise figure (NF) is:

$$NF_i = 10\log_{10}\left(1 + \frac{T_i}{T_0}\right) dB$$

wherein i=Σ or Δ corresponding to the noise figure of a dipole or loop mode, respectively, $T_i$ is a system noise temperature, and $T_0$ is a standard noise temperature.

9. The antenna of claim 8, wherein each loop antenna further comprises first and second matching networks respectively connected in parallel to the sum output port and the delta output port.

10. The antenna of claim 9, wherein the first and second matching networks are capacitors, each capacitor having two terminals, one of which is grounded and the other is connected to its respective output port of the 180° hybrid coupler.

11. The antenna of claim 10, wherein the first matching network has a value of 200 pF and the second matching network has a value of 150 pF.

12. The antenna of claim 11, wherein for each loop antenna each of the balun outputs is connected to the 180° hybrid coupler via a respective 0.5 m cable, wherein the sum and delta output ports are respectively connected to the first and second LNA via first and second 2 m cables, and the first and second LNAs are respectively connected to the first and second receivers via first and second 30 m cables.

13. The antenna of claim 8, wherein the three loops are each octagonal wherein the baluns of each loop antenna are centered on opposing sides of the corresponding octagonal loop.

14. The antenna of claim 13, wherein each loop is made of copper tubing having a loop radius of no greater than 0.54 m and a tubing diameter of no greater than 1.52 cm (0.6 in).

15. The antenna of claim 8, wherein the system noise figure is less than quiet rural noise levels set by the International Radio Consultative Committee (CCIR).

16. The antenna of claim 8, wherein the loops are positioned at least a loop diameter above a ground plane.

17. An antenna comprising:
a loop made of conductive material;
two baluns connected to, and intersecting, opposing sides of the loop, wherein each balun has an output;
a 180° hybrid coupler having two input ports, a sum output port, and a delta output port, wherein the two input ports are connected to the outputs of the baluns;
a first low noise amplifier (LNA) connected to the sum output port;
a second LNA connected to the delta output port; and
first and second receivers connected to the first and second LNAs respectively,
wherein the antenna sets a system noise level below external high frequency noise by utilizing a computation for a system noise figure that ignores bias tees and transient protection devices, wherein the computation for the system noise figure (NF) is:

$$NF_i = 10\log_{10}\left(1 + \frac{T_i}{T_0}\right) dB$$

wherein i=Σ or Δ corresponding to the noise figure of a dipole or loop mode, respectively, $T_i$ is a system noise temperature, and $T_0$ is a standard noise temperature.

* * * * *